US011650506B2

(12) United States Patent
Dai et al.

(10) Patent No.: US 11,650,506 B2
(45) Date of Patent: May 16, 2023

(54) FILM STRUCTURE FOR ELECTRIC FIELD GUIDED PHOTORESIST PATTERNING PROCESS

(71) Applicant: Applied Materials, Inc., Santa Clara, CA (US)

(72) Inventors: Huixiong Dai, San Jose, CA (US); Mangesh Bangar, San Jose, CA (US); Christopher S. Ngai, Burlingame, CA (US); Srinivas D. Nemani, Sunnyvale, CA (US); Ellie Y. Yieh, San Jose, CA (US); Steven Hiloong Welch, Milpitas, CA (US)

(73) Assignee: Applied Materials Inc., Santa Clara, CA (US)

( * ) Notice: Subject to any disclaimer, the term of this patent is extended or adjusted under 35 U.S.C. 154(b) by 333 days.

(21) Appl. No.: 16/600,101

(22) Filed: Oct. 11, 2019

(65) Prior Publication Data

US 2020/0233307 A1    Jul. 23, 2020

Related U.S. Application Data

(60) Provisional application No. 62/794,298, filed on Jan. 18, 2019.

(51) Int. Cl.
*G03F 7/11*  (2006.01)
*G03F 7/20*  (2006.01)
(Continued)

(52) U.S. Cl.
CPC ............ *G03F 7/2022* (2013.01); *G03F 7/094* (2013.01); *G03F 7/11* (2013.01); *G03F 7/168* (2013.01);
(Continued)

(58) Field of Classification Search
CPC .......... G03F 7/164; G03F 7/168; G03F 7/094; G03F 7/203; G03F 7/11; G03F 7/2022; G03F 7/40
See application file for complete search history.

(56) References Cited

U.S. PATENT DOCUMENTS

| 4,842,683 | A |   | 6/1989 | Cheng et al. |
| 5,158,861 | A | * | 10/1992 | Tokui ........................ G03F 7/38 430/326 |

(Continued)

FOREIGN PATENT DOCUMENTS

| CN | 102244023 A | 11/2011 |
| JP | 2003-124088 A | 4/2003 |

(Continued)

OTHER PUBLICATIONS

International Search Report and Written Opinion for PCT/US2019/055863 dated Jan. 30, 2020.

(Continued)

*Primary Examiner* — Amanda C. Walke
(74) *Attorney, Agent, or Firm* — Patterson + Sheridan, LLP; Keith Taboada

(57) ABSTRACT

Methods and apparatuses for minimizing line edge/width roughness in lines formed by photolithography are provided. In one example, a method of processing a substrate includes applying a photoresist layer comprising a photoacid generator to on a multi-layer disposed on a substrate, wherein the multi-layer comprises an underlayer formed from an organic material, inorganic material, or a mixture of organic and inorganic materials, exposing a first portion of the photoresist layer unprotected by a photomask to a radiation light in a lithographic exposure process, and applying an electric (Continued)

field or a magnetic field to alter movement of photoacid generated from the photoacid generator substantially in a vertical direction.

15 Claims, 5 Drawing Sheets

(51) Int. Cl.
| | |
|---|---|
| *G03F 7/09* | (2006.01) |
| *G03F 7/16* | (2006.01) |
| *G03F 7/40* | (2006.01) |

(52) U.S. Cl.
CPC .............. *G03F 7/203* (2013.01); *G03F 7/164* (2013.01); *G03F 7/40* (2013.01)

(56) References Cited

U.S. PATENT DOCUMENTS

| | | | |
|---|---|---|---|
| 5,215,619 A | 6/1993 | Cheng et al. | |
| 5,258,266 A | 11/1993 | Tokui et al. | |
| 5,345,145 A | 9/1994 | Harafuji et al. | |
| 5,731,123 A | 3/1998 | Kawamura et al. | |
| 6,079,358 A | 6/2000 | Kim et al. | |
| 6,113,731 A | 9/2000 | Shan et al. | |
| 6,143,124 A | 11/2000 | Ahn | |
| 6,187,152 B1 | 2/2001 | Ting et al. | |
| 6,242,164 B1 | 6/2001 | Choi et al. | |
| 6,376,152 B2 | 4/2002 | Kawabe et al. | |
| 6,488,807 B1 | 12/2002 | Collins et al. | |
| 6,686,132 B2 | 2/2004 | Cheng et al. | |
| 6,841,342 B2 | 1/2005 | Nishi et al. | |
| 6,889,627 B1 | 5/2005 | Hao | |
| 7,187,796 B1 | 3/2007 | Phan et al. | |
| 7,274,429 B2 | 9/2007 | Paxton et al. | |
| 7,318,997 B2 | 1/2008 | Kim et al. | |
| 7,374,867 B2 | 5/2008 | Bristol et al. | |
| 7,474,377 B2 | 1/2009 | Matsuoka et al. | |
| 7,585,609 B2 * | 9/2009 | Larson ................. | G03F 7/094 |
| | | | 430/156 |
| 7,780,366 B2 | 8/2010 | Ogata et al. | |
| 7,780,813 B2 | 8/2010 | Pau et al. | |
| 8,097,402 B2 | 1/2012 | Scheer et al. | |
| 8,741,553 B2 * | 6/2014 | Higashihara ............. | C08G 8/00 |
| | | | 430/323 |
| 8,829,393 B2 | 9/2014 | Jennings et al. | |
| 9,046,764 B2 * | 6/2015 | Tachibana ............... | G03F 7/004 |
| 9,146,468 B2 * | 9/2015 | Hatakeyama ..... | H01L 21/31138 |
| 9,280,070 B2 | 3/2016 | Xie et al. | |
| 9,366,966 B2 * | 6/2016 | Xie ....................... | G03F 7/0045 |
| 9,733,579 B2 | 8/2017 | Nam et al. | |
| 9,798,240 B2 | 10/2017 | Xie et al. | |
| 9,829,790 B2 | 11/2017 | Buchberger, Jr. et al. | |
| 9,964,863 B1 | 5/2018 | Babayan et al. | |
| 10,203,604 B2 | 2/2019 | Babayan et al. | |
| 2002/0096114 A1 | 7/2002 | Carducci et al. | |
| 2002/0123011 A1 | 9/2002 | Kawano et al. | |
| 2002/0129902 A1 | 9/2002 | Babayan et al. | |
| 2003/0008246 A1 * | 1/2003 | Cheng ...................... | G03F 7/38 |
| | | | 430/326 |
| 2003/0037880 A1 | 2/2003 | Carducci et al. | |
| 2004/0001787 A1 | 1/2004 | Porshnev et al. | |
| 2004/0016637 A1 | 1/2004 | Yang et al. | |
| 2005/0074706 A1 * | 4/2005 | Bristol ...................... | G03F 1/24 |
| | | | 430/311 |
| 2005/0250052 A1 | 11/2005 | Nguyen | |
| 2006/0130751 A1 | 6/2006 | Volfovski et al. | |
| 2006/0177586 A1 | 8/2006 | Ishida et al. | |
| 2007/0000613 A1 | 1/2007 | Pau et al. | |
| 2007/0077171 A1 | 4/2007 | Hamada | |
| 2007/0144439 A1 | 6/2007 | Englhardt et al. | |
| 2007/0177870 A1 | 8/2007 | Hamada | |
| 2008/0008967 A1 * | 1/2008 | Chang .................. | G03F 7/0382 |
| | | | 430/311 |
| 2008/0050679 A1 | 2/2008 | Salek et al. | |
| 2008/0145797 A1 | 6/2008 | Verbeke et al. | |
| 2008/0182412 A1 | 7/2008 | Bailey, III et al. | |
| 2008/0304940 A1 | 12/2008 | Auer-Jongepier et al. | |
| 2009/0002722 A1 | 1/2009 | Hayasaki et al. | |
| 2009/0142926 A1 | 6/2009 | Dai et al. | |
| 2009/0211523 A1 | 8/2009 | Kuppurao et al. | |
| 2010/0009274 A1 | 1/2010 | Yamamoto | |
| 2010/0203299 A1 | 8/2010 | Abdallah et al. | |
| 2011/0143149 A1 | 6/2011 | Shibayama et al. | |
| 2011/0165515 A1 | 7/2011 | Wang et al. | |
| 2012/0031894 A1 | 2/2012 | Shigetomi | |
| 2012/0103939 A1 | 5/2012 | Wu et al. | |
| 2012/0129108 A1 | 5/2012 | Aqad et al. | |
| 2012/0244645 A1 | 9/2012 | Rathsack et al. | |
| 2012/0285621 A1 | 11/2012 | Tan | |
| 2012/0322011 A1 * | 12/2012 | Wu .......................... | G03F 7/36 |
| | | | 430/432 |
| 2012/0325784 A1 | 12/2012 | Moffatt et al. | |
| 2014/0193755 A1 | 7/2014 | Wise et al. | |
| 2015/0135993 A1 | 5/2015 | Buckland et al. | |
| 2015/0210829 A1 | 7/2015 | Shibayama et al. | |
| 2015/0218697 A1 | 8/2015 | Nguyen et al. | |
| 2015/0378260 A1 | 12/2015 | Endo et al. | |
| 2016/0011515 A1 | 1/2016 | Xie et al. | |
| 2016/0109813 A1 | 4/2016 | Nam et al. | |
| 2016/0357107 A1 | 12/2016 | Buchberger, Jr. et al. | |
| 2017/0184976 A1 | 6/2017 | Ouyang et al. | |
| 2018/0004094 A1 | 1/2018 | Hanson et al. | |
| 2018/0102282 A1 | 4/2018 | Krysak et al. | |
| 2018/0107117 A1 | 4/2018 | Ouyang et al. | |
| 2018/0164689 A1 | 6/2018 | Sano et al. | |

FOREIGN PATENT DOCUMENTS

| | | |
|---|---|---|
| JP | 2005203597 A | 7/2005 |
| KR | 20140036166 A | 3/2014 |
| KR | 101647158 B1 | 8/2016 |
| KR | 20170107592 A | 9/2017 |
| WO | 2010021290 A1 | 2/2010 |
| WO | 2010055852 A1 | 4/2012 |
| WO | 2014129582 A1 | 8/2014 |
| WO | 2014021256 A1 | 7/2016 |
| WO | 2018-004815 A1 | 1/2018 |
| WO | 2018125381 A2 | 7/2018 |

OTHER PUBLICATIONS

Jung, Byungki, et al., "LWR Reduction and Flow of Chemically Amplified Resist Patterns During Sub-Millisecond Heating", Advances in Resist Materials and Processing Technology XXVIII, vol. 7972, 79722S, 2011. (8 pgs.).
Jung, Byungki, et al. "Kinetic Rates of Thermal Transformations and Diffusion in Polymer Systems Measured during Sub-millisecond Laset-Induced Heating", American Chemical Society, vol. 6, No. 7, pp. 5830-5836, 2012.
Conference proceedings of SPIE 2016, "EUV resists: What's next?," Lio, Anna.
Office Action for U.S. Appl. No. 14/677,552 dated Jul. 1, 2016.
Conference proceedings of SPIE 2017, "Lithographic stochastics: Beyond 3sigma," Bristol, Robert, Krysak, Marie.
Office Action for U.S. Appl. No. 14/677,552 dated Jun. 16, 2017.
Written Opinion for PCT/US2017/059969 dated Feb. 9, 2018.
Office Action for Taiwan Application No. 106140879 dated Nov. 13, 2019.
Communication pursuant to Rule 164(1) EPC and Search Report for European Application No. 17885260.4 dated Jun. 16, 2020.
Journal of Micro/Nanolithogarphy Jul. 2020, MEMS, and MOEMS, "Stochastic effects in EUV lithography: random, local CD variability, and printing failures," Peter De Bisschop.
K. Xu et al. "15nm HP patterning with EUV and SADP: key contributors for improvement of LWR, LER, and CDU", Proc. SPIE 8685, Advanced Etch Technology for Nanopatterning II, 86850C (Mar. 29, 2013).
Japanese Office Action for Patent Application No. 2021-540445 dated Sep. 20, 2022.

(56) References Cited

OTHER PUBLICATIONS

Japanese Office Action for Patent Application No. 2021-540445 dated Mar. 14, 2023.

* cited by examiner

FILM STRUCTURE FOR ELECTRIC FIELD GUIDED PHOTORESIST PATTERNING PROCESS

CROSS-REFERENCE TO RELATED APPLICATIONS

This application claims benefit of U.S. Provisional Application Ser. No. 62/794,298 filed Jan. 18, 2019, which is incorporated by reference in its entirety.

BACKGROUND

Field

The present disclosure generally relates to methods and apparatuses for processing a substrate, and more specifically to methods and apparatuses for enhancing photoresist profile control.

Description of the Related Art

Integrated circuits have evolved into complex devices that can include millions of components (e.g., transistors, capacitors and resistors) on a single chip. Photolithography may be used to form components on a chip. Generally the process of photolithography involves a few basic stages. Initially, a photoresist layer is formed on a substrate. The photoresist layer may be formed by, for example, spin-coating. The photoresist layer may include a resist resin and a photoacid generator. The photoacid generator, upon exposure to electromagnetic radiation in the subsequent exposure stage, alters the solubility of the photoresist in the development process. The electromagnetic radiation may have any suitable wavelength, such as a wavelength in the extreme ultra violet region. The electromagnetic radiation may be from any suitable source, such as, for example, a 193 nm ArF laser, an electron beam, an ion beam, or other source. Excess solvent may then be removed in a pre-exposure bake process.

In an exposure stage, a photomask or reticle may be used to selectively expose certain regions of a photoresist layer disposed on the substrate to electromagnetic radiation. Other exposure methods may be maskless exposure methods. Exposure to light may decompose the photoacid generator, which generates acid and results in a latent acid image in the resist resin. After exposure, the substrate may be heated in a post-exposure bake process. During the post-exposure bake process, the acid generated by the photoacid generator reacts with the resist resin in the photoresist layer, changing the solubility of the resist of the photoresist layer during the subsequent development process.

After the post-exposure bake, the substrate, and, particularly, the photoresist layer may be developed and rinsed. After development and rinsing, a patterned photoresist layer is then formed on the substrate, as shown in FIG. 1. FIG. 1 depicts an exemplary top sectional view of the substrate 100 having the patterned photoresist layer 104 disposed on a target material 102 to be etched. Openings 106 are defined between the patterned photoresist layer 104, after the development and rinse processes, exposing the underlying target material 102 for etching to transfer features onto the target material 102. However, inaccurate control or low resolution of the lithography exposure process may cause in poor critical dimension of the photoresist layer 104, resulting in unacceptable line width roughness (LWR) 108. Furthermore, during the exposure process, acid (shown as in FIG. 1) generated from the photoacid generator may randomly diffuse to any regions, including the regions protected under the mask unintended to be diffused, thus creating undesired wigging or roughness profile 150 at the edge or interface of the patterned photoresist layer 104 interfaced with the openings 106. Large line width roughness (LWR) 108 and undesired wiggling profile 150 of the photoresist layer 104 may result in inaccurate feature transfer to the target material 102, thus, eventually leading to device failure and yield loss.

Therefore, there is a need for a method and an apparatus to control line width roughness (LWR) and enhance resolution as well as dose sensitivity so as to obtain a patterned photoresist layer with desired critical dimensions.

SUMMARY

Embodiments of the present disclosure include a method for forming a film structure to efficiently control of distribution and diffusion of acid from a photoacid generator in a photoresist layer during an exposure process or a pre- or post-exposure baking process. In one example, a device structure includes a film structure disposed on a substrate, and a plurality of openings formed in the film structure, wherein the openings formed across the substrate has a critical dimension uniformity between about 1 nm and 2 nm.

In another embodiment, a method of processing a substrate includes applying a photoresist layer comprising a photoacid generator to on a multi-layer disposed on a substrate, wherein the multi-layer comprises an underlayer formed from an organic material, inorganic material, or a mixture of organic and inorganic materials, exposing a first portion of the photoresist layer unprotected by a photomask to a radiation light in a lithographic exposure process, and applying an electric field or a magnetic field to alter movement of photoacid generated from the photoacid generator substantially in a vertical direction.

In yet another embodiment, a method of processing a substrate includes applying a photoresist layer on an underlayer disposed on a substrate, exposing a first portion of the photoresist layer unprotected by a photomask to a radiation light in a lithographic exposure process, performing a baking process on the photoresist layer and the underlayer, and applying an electric field or a magnetic field while performing the baking process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Methods for enhancing profile control of a photoresist layer formed by photolithography are provided. The diffusion of acid generated by a photoacid generator during a post-exposure bake procedure that contributes to line edge/width roughness may be mitigated by utilizing a film structure disposed under the photoresist layer as disclosed herein. The electric field application controls the diffusion and distribution of the acids generated by the photoacid generator in the photoresist layer as well as in an underlayer disposed in a film structure under the photoresist layer, thus preventing the line edge/width roughness that results from random diffusion. Methods for forming a film structure disposed under the photoresist layer utilized to control aforementioned acid distribution and diffusion are disclosed herein.

Figure 2:
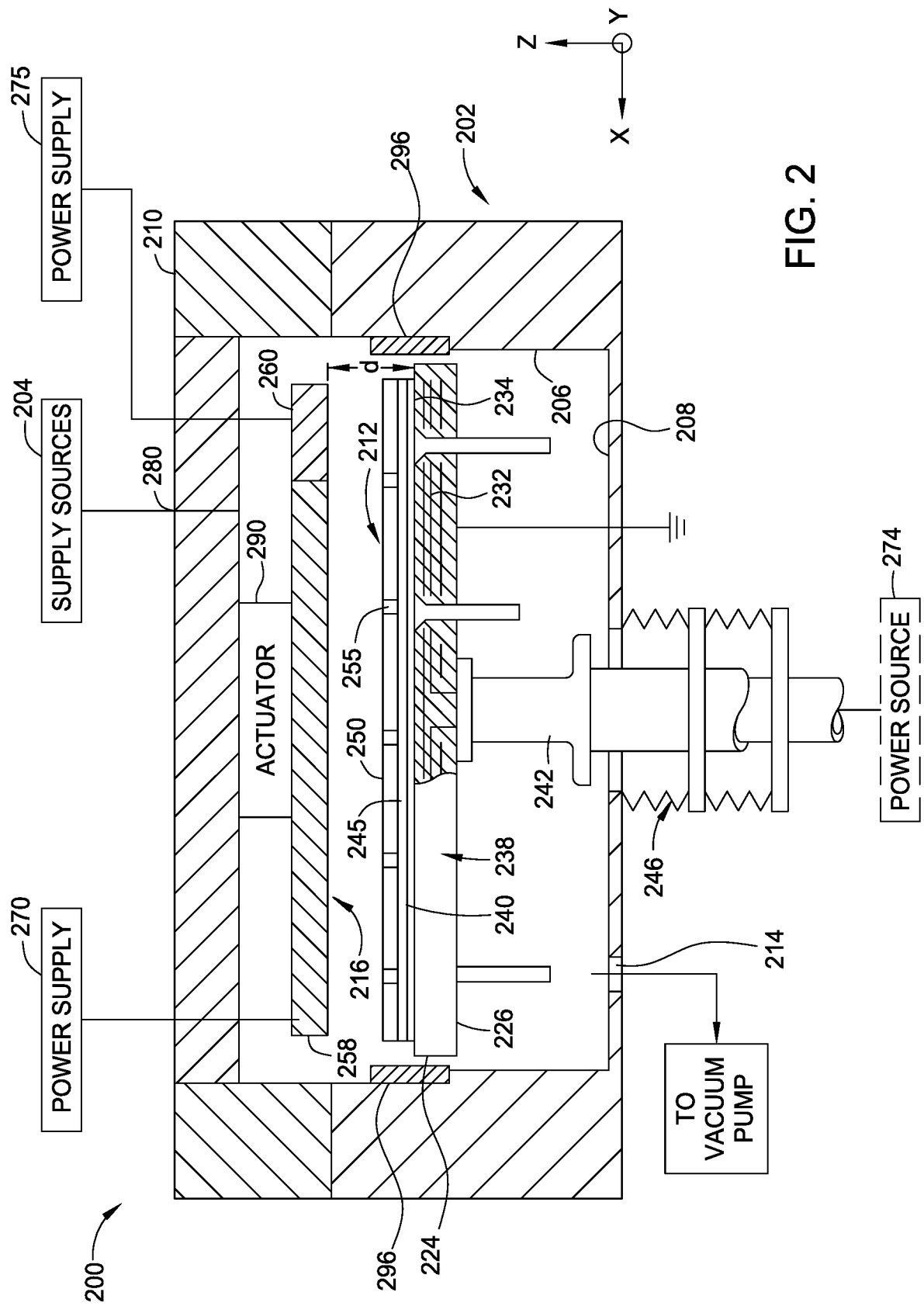
FIG. 2 is a schematic cross-sectional view of an apparatus for processing a substrate, according to one embodiment.

FIG. 2 is a schematic cross-sectional view of an apparatus for processing a substrate, according to one embodiment. As shown in the embodiment of FIG. 2, the apparatus may be in the form of a vacuum processing chamber 200. In other embodiments, the processing chamber 200 may not be coupled to a vacuum source.

The processing chamber 200 may be an independent stand alone processing chamber. Alternatively, the processing chamber 200 may be part of a processing system, such as, for example, an in-line processing system, a cluster processing system, or the track processing system as needed. The processing chamber 200 is described in detail below and may be used for a pre-exposure bake, a post-exposure bake, and/or other processing steps.

The processing chamber 200 includes chamber walls 202, an electrode assembly 216, and a substrate support assembly 238. The chamber walls 202 include sidewalls 206, a lid assembly 210, and a bottom 208. The chamber walls 202 partially enclose a processing volume 212. The processing volume 212 is accessed through a substrate transfer port (not shown) configured to facilitate movement of a substrate 240 into and out of the processing chamber 200. In embodiments where the processing chamber 200 is part of a processing system, the substrate transfer port may allow for the substrate 240 to be transferred to and from an adjoining transfer chamber.

A pumping port 214 may optionally be disposed through one of the lid assembly 210, sidewalls 206 or bottom 208 of the processing chamber 200 to couple the processing volume 212 to an exhaust port. The exhaust port couples the pumping port 214 to various vacuum pumping components, such as a vacuum pump. The pumping components may reduce the pressure of the processing volume 212 and exhaust any gases and/or process by-products out of the processing chamber 200. The processing chamber 200 may be coupled to one or more supply sources 204 for delivering one or more source compounds into the processing volume 212.

The substrate support assembly 238 is centrally disposed within the processing chamber 200. The substrate support assembly 238 supports the substrate 240 during processing. The substrate support assembly 238 may comprise a body 224 that encapsulates at least one embedded heater 232. In some embodiments, the substrate support assembly 238 may be an electrostatic chuck. The heater 232, such as a resistive element, is disposed in the substrate support assembly 238. The heater 232 controllably heats the substrate support assembly 238 and the substrate 240 positioned thereon to a predetermined temperature. The heater 232 is configured to quickly ramp the temperature of the substrate 240 and to accurately control the temperature of the substrate 240. In some embodiments, the heater 232 is connected to and controlled by the power source 274. The power source 274 may alternatively or additionally apply power to the substrate support assembly 238. The power source 274 may be configured similarly to the power source 270, discussed below. Furthermore, it is noted that the heater 232 may be disposed from other locations of the processing chamber 200, such as from chamber wall, chamber liner, edge ring that circumscribes the substrate, the chamber ceiling and the like, as needed to provide thermal energy to the substrate 240 disposed on the substrate support assembly 238

In some embodiments, the substrate support assembly 238 may be configured to rotate. In some embodiments, the substrate support assembly 238 is configured to rotate about the z-axis. The substrate support assembly 238 may be configured to continuously or constantly rotate, or the substrate support assembly 238 may be configured to rotate in a step-wise or indexing manner. For example, the substrate support assembly 238 may rotate a predetermined amount, such as 90°, 180°, or 270°, and then rotation may stop for a predetermined amount of time.

Generally, the substrate support assembly 238 has a first surface 234 and a second surface 226. The first surface 234 is opposite the second surface 226. The first surface 234 is configured to support the substrate 240. The second surface 226 has a stem 242 coupled thereto. The substrate 240 may be any type of substrate, such as a dielectric substrate, a glass substrate, a semiconductor substrate, or a conductive substrate. The substrate 240 may have a material layer 245 disposed thereon. The material layer 245 may be any desired layer. In other embodiments, the substrate 240 may have more than one material layer 245. The substrate 240 also has a photoresist layer 250 disposed over the material layer 245. The substrate 240 has been previously exposed to electromagnetic radiation in an exposure stage of a photolithography process. The photoresist layer 250 has latent image lines 255 formed therein from the exposure stage. The latent image lines 255 may be substantially parallel. In other embodiments, the latent image lines 255 may not be substantially parallel. Also as shown, the first surface 234 of the substrate support assembly 238 is separated from the electrode assembly 216 by a distance d in the z-direction. The stem 242 is coupled to a lift system (not shown) for moving the substrate support assembly 238 between an elevated processing position (as shown) and a lowered substrate transfer position. The lift system may accurately and precisely control the position of the substrate 240 in the z-direction. In some embodiments, the lift system may also be configured to move the substrate 240 in the x-direction, the y-direction, or the x-direction and the y-direction. The stem 242 additionally provides a conduit for electrical and thermocouple leads between the substrate support assembly 238 and other components of the processing chamber 200. A bellows 246 is coupled to the substrate support assembly 238 to provide a vacuum seal between the processing volume 212 and the atmosphere outside the processing chamber 200 and facilitate movement of the substrate support assembly 238 in the z-direction.

The lid assembly 210 may optionally include an inlet 280 through which gases provided by the supply sources 204 may enter the processing chamber 200. The supply sources 204 may optionally controllably pressurize the processing volume 212 with a gas, such as nitrogen, argon, helium, other gases, or combinations thereof. The gases from the supply sources 204 may create a controlled environment within the processing chamber 200. An actuator 290 may be optionally coupled between the lid assembly 210 and the electrode assembly 216. The actuator 290 is configured to move the electrode assembly 216 in one or more of the x, y, and z directions. The x and y directions are referred to herein as the lateral directions or dimensions. The actuator 290 enables the electrode assembly 216 to scan the surface of the substrate 240. The actuator 290 also enables the distance d to be adjusted. In some embodiments the electrode assembly 216 is coupled to the lid assembly 210 by a fixed stem (not shown). In other embodiments, the electrode assembly 216 may be coupled to the inside of the bottom 208 of the processing chamber 200, to the second surface 226 of the substrate support assembly 238, or to the stem 242. In still other embodiments, the electrode assembly 216 may be embedded between the first surface 234 and the second surface 226 of the substrate support assembly 238.

The electrode assembly 216 includes at least a first electrode 258 and a second electrode 260. As shown, the first electrode 258 is coupled to a power source 270, and the second electrode 260 is coupled to an optional power supply 275. In other embodiments, one of the first electrode 258 and the second electrode 260 may be coupled to a power supply and the other electrode may be coupled to a ground. In some embodiments, the first electrode 258 and the second electrode 260 are coupled to a ground and the power source 274 that delivers power to the substrate support is a bipolar power supply that switches between a positive and negative bias. In some embodiments, the power source 270 or the power supply 275 may be coupled to both the first electrode 258 and the second electrode 260. In other embodiments, the power source 270 or the power supply 275 may be coupled to the first electrode 258, the second electrode 260, and the substrate support assembly 238. In such embodiments, the pulse delay to each of the first electrode 258, the second electrode 260, and the substrate support assembly 238 may be different. The electrode assembly 216 may be configured to generate an electric field parallel to the x-y plane defined by the first surface of the substrate support assembly 238. For example, the electrode assembly 216 may be configured to generate an electric field in one of the y direction, x direction or other direction in the x-y plane.

The power source 270 and the power supply 275 are configured to supply, for example, between about 500 V and about 100 kV to the electrode assembly 216, to generate an electric field having a strength between about 0.1 MV/m and about 100 MV/m. In some embodiments, the power source 274 may also be configured to provide power to the electrode assembly 216. In some embodiments, any or all of the power source 270, the power source 274, or the power supply 275 are a pulsed direct current (DC) power supply. The pulsed DC wave may be from a half-wave rectifier or a full-wave rectifier. The DC power may have a frequency of between about 10 Hz and 1 MHz. The duty cycle of the pulsed DC power may be from between about 5% and about 95%, such as between about 20% and about 60%. In some embodiments, the duty cycle of the pulsed DC power may be between about 20% and about 40%. In other embodiments, the duty cycle of the pulsed DC power may be about 60%. The rise and fall time of the pulsed DC power may be between about 1 ns and about 1000 ns, such as between about 10 ns and about 500 ns. In other embodiments, the rise and fall time of the pulsed DC power may be between about 10 ns and about 100 ns. In some embodiments, the rise and fall time of the pulsed DC power may be about 500 ns. In some embodiments, any or all of the power source 270, the power source 274, and the power supply 275 are an alternating current power supply. In other embodiments, any or all of the power source 270, the power source 274, and the power supply 275 are a direct current power supply.

In some embodiments, any or all of the power source 270, the power source 274, and the power supply 275 may use a DC offset. The DC offset may be, for example, between about 0% and about 75% of the applied voltage, such as between about 5% and about 60% of the applied voltage. In some embodiments, the first electrode 258 and the second electrode 260 are pulsed negatively while the substrate support assembly 238 is also pulsed negatively. In these embodiments, the first electrode 258 and the second electrode 260 and the substrate support assembly 238 are synchronized but offset in time. For example, the first electrode 258 may be at the "one" state while the substrate support assembly is at the "zero" state," then the substrate support assembly 238 in the one state while the first electrode 258 is at the zero state.

The electrode assembly 216 spans approximately the width of the substrate support assembly 238. In other embodiments, the width of the electrode assembly 216 may be less than that of the substrate support assembly 238. For example, the electrode assembly 216 may span between about 10% to about 80%, such as about 20% and about 40%, the width of the substrate support assembly 238. In embodiments where the electrode assembly 216 is less wide than the substrate support assembly 238, the actuator 290 may scan the electrode assembly 216 across the surface of the substrate 240 positioned on the first surface 234 of the substrate support assembly 238. For example, the actuator 290 may scan such that the electrode assembly 216 scans the entire surface of the substrate 240. In other embodiments, the actuator 290 may scan only certain portions of the substrate 240. Alternatively, the substrate support assembly 238 may scan underneath the electrode assembly 216.

Figure 1:
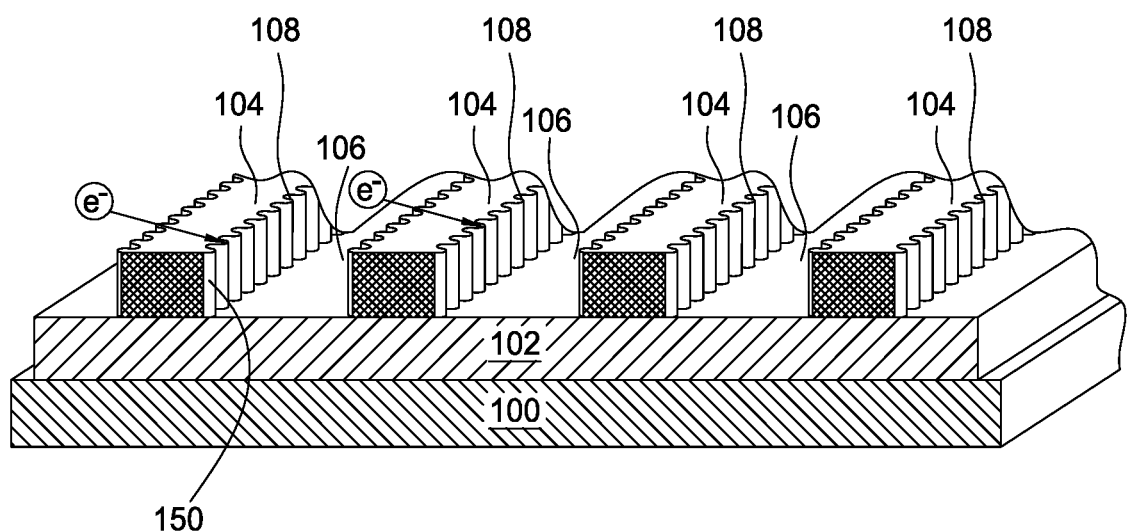
FIG. 1 depicts a top view of an exemplary structure of a patterned photoresist layer disposed on a substrate conventionally in the art.

In some embodiments, one or more magnets 296 may be positioned in the processing chamber 200. In the embodiment shown in FIG. 1, the magnets 296 are coupled to the inside surface of the sidewalls 206. In other embodiments, the magnets 296 may be positioned in other locations within the processing chamber 200 or outside the processing chamber 200. The magnets 296 may be, for example, permanent magnets or electromagnets. Representative permanent magnets include ceramic magnets and rare earth magnets. In embodiments where the magnets 296 include electromagnets, the magnets 296 may be coupled to a power source (not shown). The magnets 296 are configured to generate a magnetic field in a direction perpendicular or parallel to the direction of the electric field lines generated by the electrode assembly 216 at the first surface 234 of the substrate support assembly 238. For example, the magnets 296 may be configured to generate a magnetic field in the x-direction when the electric field generated by the electrode assembly 216 is in the y-direction. The magnetic field drives the charged species 355 (shown in FIG. 3) and polarized species (not shown) generated by the photoacid generators in the photoresist layer 250 in a direction perpendicular to the magnetic field, such as the direction parallel with the latent image lines 255. By driving the charged species 355 and polarized species in a direction parallel with the latent image lines 255, line roughness may be reduced. The uniform directional movement of the charged species 355 and polarized species is shown by the double headed arrow 370 in FIG. 3. In contrast, when a magnetic field is not applied, the charged species 355 and polarized species may move randomly, as shown by the arrows 370'.

Figure 3:
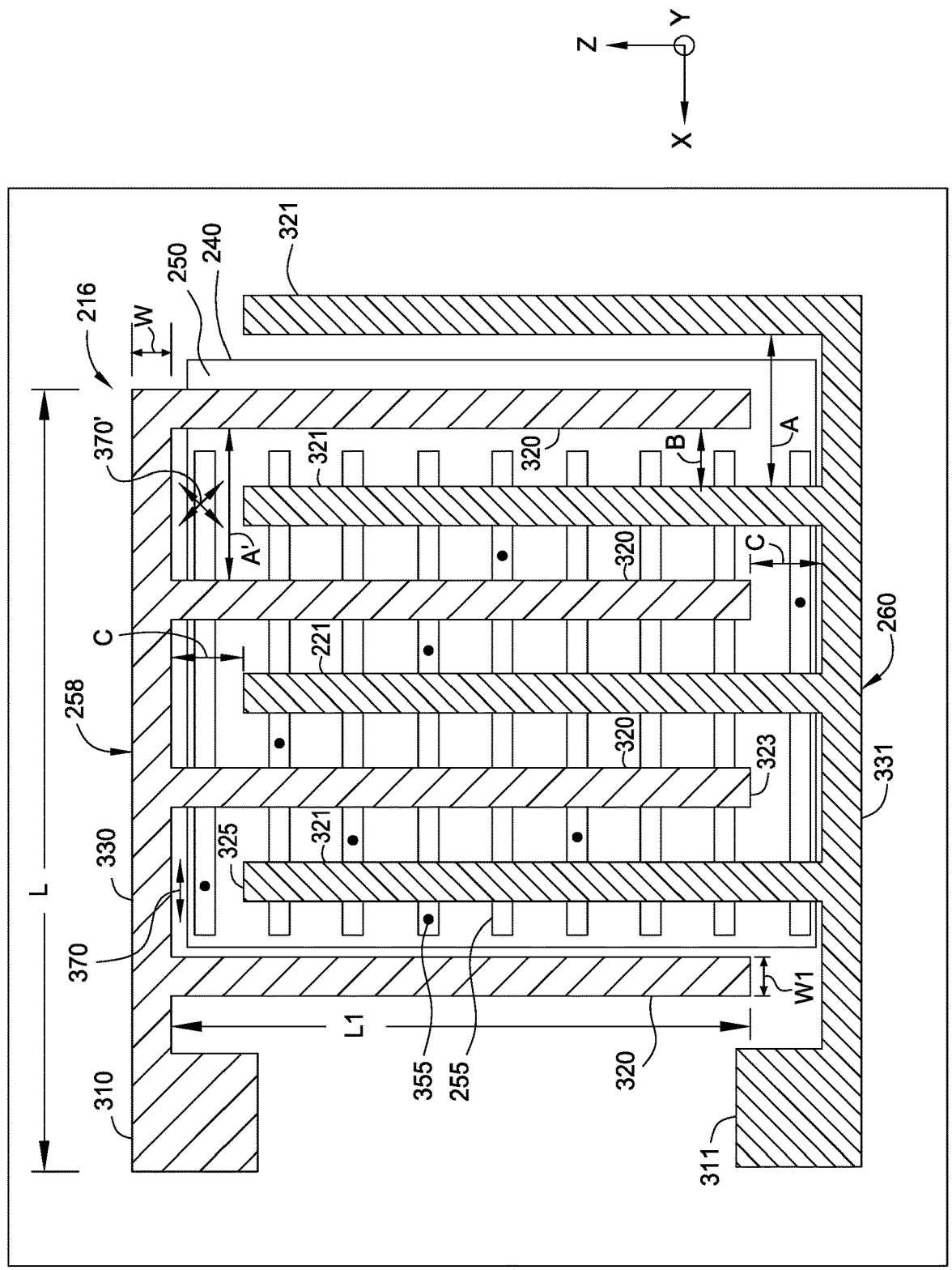
FIG. 3 is a top view of one embodiment of an electrode assembly disposed in the apparatus of FIG. 2.

Continuing to refer to FIG. 3, the electrode assembly 216 includes at least the first electrode 258 and the second electrode 260. The first electrode 258 includes a first terminal 310, a first support structure 330, and one or more antennas 320. The second electrode 260 includes a second terminal 311, a second support structure 331, and one or more antennas 321. The first terminal 310, the first support structure 330, and the one or more antennas 320 of the first electrode 258 may form a unitary body. Alternatively, the first electrode 258 may include separate portions that may be coupled together. For example, the one or more antennas 320 may be detachable from the first support structure 330. The second electrode 260 may similarly be a unitary body or be comprised of separate detachable components. The first electrode 258 and the second electrode 260 may be fabricated by any suitable technique. For example, the first electrode 258 and the second electrode 260 may be fabricated by machining, casting, or additive manufacturing.

The first support structure 330 may be made from a conductive material, such as metal. For example, the first support structure 330 may be made of silicon, polysilicon, silicon carbide, molybdenum, aluminum, copper, graphite, silver, platinum, gold, palladium, zinc, other materials, or mixtures thereof. The first support structure 330 may have any desired dimensions. For example, the length L of the first support structure 330 may be between about 25 mm and about 450 mm, for example, between about 100 mm and about 300 mm. In some embodiments, the first support structure 330 has a length L approximately equal to a diameter of a standard semiconductor substrate. In other embodiments, the first support structure 330 has a length L that is larger or smaller than the diameter of a standard semiconductor substrate. For example, in different representative embodiments, the length L of the first support structure 330 may be about 25 mm, about 51 mm, about 76 mm, about 100 mm, about 150 mm, about 200 mm, about 300 mm, or about 450 mm. The width W of the first support structure 330 may be between about 2 mm and about 25 mm. In other embodiments, the width W of the first support structure 330 is less than about 2 mm. In other embodiments, the width W of the first support structure 330 is greater than about 25 mm. The thickness of the first support structure 330 may be between about 1 mm and about 10 mm, such as between about 2 mm and about 8 mm, such as about 5 mm. In some embodiments, the first support structure 330 may be square, cylindrical, rectangular, oval, rods, or other shapes. Embodiments having curved exterior surfaces may avoid arcing.

The support structure 330 may be made of the same materials as the second support structure 331. The range of dimensions suitable for the first support structure 330 is also suitable for the second support structure 331. In some embodiments, the first support structure 330 and the second support structure 331 are made of the same material. In other embodiments, the first support structure 330 and the second support structure 331 are made of different materials. The lengths L, widths W, and thicknesses of the first support structure 330 and the second support structure 331 may be the same or different.

The one or more antennas 320 of the first electrode 258 may also be made from a conductive material. The one or more antennas 320 may be made from the same materials as the first support structure 330. The one or more antennas 320 of the first electrode 258 may have any desired dimensions. For example, a length L1 of the one or more antennas 320 may be between about 25 mm and about 450 mm, for example, between about 100 mm and about 300 mm. In some embodiments, the one or more antennas 320 have a length L1 approximately equal to the diameter of a standard substrate. In other embodiments, the length L1 of the one or more antennas 320 may be between about 75% and 90% of the diameter of a standard substrate. A width W1 of the one or more antennas 320 may be between about 2 mm and about 25 mm. In other embodiments, the width W1 of the one or more antennas 320 is less than about 2 mm. In other embodiments, the width W1 of the one or more antennas 320 is greater than about 25 mm. The thickness of the one or more antennas 320 may be between about 1 mm and about 10 mm, such as between about 2 mm and about 8 mm. The one or more antennas 320 may have a cross-section that is square, rectangular, oval, circular, cylindrical, or another shape. Embodiments having round exterior surfaces may avoid arcing.

Each of the antennas 320 may have the same dimensions. Alternatively, some of the one or more antennas 320 may have different dimensions than one or more of the other antennas 320. For example, some of the one or more antennas 320 may have different lengths L1 than one or more of the other antennas 320. Each of the one or more antennas 320 may be made of the same material. In other embodiments, some of the antennas 320 may be made of a different material than other antennas 320.

The antennas 321 may be made of the same range of materials as the antennas 320. The range of dimensions suitable for the antennas 320 is also suitable for the antennas 321. In some embodiments, the antennas 320 and the antennas 321 are made of the same material. In other embodiments, the antennas 320 and the antennas 321 are made of different materials. The lengths L1, widths W1, and thicknesses of the antennas 320 and the antennas 321 may be the same or different.

The antennas 320 may include between 1 and about 40 antennas 320. For example, the antennas 320 may include between about 4 and about 40 antennas 320, such as between about 10 and about 20 antennas 320. In other embodiments, the antennas 320 may include more than 40 antennas 320. In some embodiments, each of the antennas 320 may be substantially perpendicular to the first support structure 330. For example, in embodiments where the first support structure 330 is straight, each antenna 320 may be substantially parallel to the first support structure 330. Each of the antennas 320 may be substantially parallel to each of the other antennas 320. Each of the antennas 321 may be similarly positioned with respect to the support structure 331 and each other antenna 321.

Each of the antennas 320 has a terminal end 323. Each of the antennas 321 has a terminal end 325. A distance C is defined between the first support structure 330 and the terminal end 325. A distance C' is defined between the second support structure 331 and the terminal end 323. Each of the distances C and C' may be between about 1 mm and about 10 mm. In other embodiments, the distances C and C' may be less than about 1 mm or greater than about 10 mm. In some embodiments, the distance C and the distance C' are equal. In other embodiments, the distance C and the distance C' are different.

A distance A is defined between facing surfaces of one of the antennas 321 and an adjacent one of the antennas 321. The distance A' is defined between facing surfaces of one antenna 320 and an adjacent one the antennas 320. The distances A and A' may be greater than about 6 mm. For example, the distances A and A' may be between about 6 mm and about 20 mm, such as between about 10 mm and about 15 mm. The distances A and A' between each adjacent antennas 321, 320 may be the same or different. For example, the distances A' between the first and second, second and third, and third and fourth antennas of the one or more antennas 320 may be different. In other embodiments, the distances A' may be the same.

A distance B is defined between facing surfaces of one of the antennas 320 and an adjacent one of the antennas 321. The distance B may be, for example, greater than about 1 mm. For example, the distance B may be between about 2 mm and about 10 mm, such as between about 4 mm and about 6 mm. Each distance B may be the same, each distance B may be different, or some distances B may be the same and some distances B may be different. Adjusting the distance B allows for easy control of the electric field strength.

The antennas 320, 321 may be oriented in an alternating arrangement above the photoresist layer 250. For example, the antennas 320 of the first electrode 258 and the antennas 321 of the second electrode 260 may be positioned such that at least one of the antennas 320 is positioned between two of the antennas 321. Additionally, at least one antenna 321 may be positioned between two of the antennas 320. In some embodiments, all but one of the antennas 320 is positioned between two of the antennas 321. In those embodiments, all but one of the antennas 321 may be positioned between two of the antennas 320. In some embodiments, the antennas 320 and the antennas 321 may each have only one antenna.

In some embodiments, the first electrode 258 has a first terminal 310, and the second electrode 260 has a second terminal 311. The first terminal 310 may be a contact between the first electrode 258 and the power source 270, the power supply 275, or a ground. The second terminal 311 may be a contact between the second electrode 260 and the power source 270, the power supply 275, or a ground. The first terminal 310 and the second terminal 311 are shown as being at one end of the first electrode 258 and the second electrode 260, respectively. In other embodiments, the first terminal 310 and the second terminal 311 may be positioned at other locations on the first electrode 258 and the second electrode, respectively. The first terminal 310 and the second terminal 311 have different shapes and sizes than the first support structure 330 and the support structure 331, respectively. In other embodiments, the first terminal 310 and the second terminal 311 may have generally the same shapes and sizes as the first support structure 330 and the support structure 331, respectively.

In operation, a voltage may be supplied from a power supply, such as the power source 270, the power source 274, or the power supply 275, to the first terminal 310, the second terminal 311, and/or the substrate support assembly 238. The supplied voltage creates an electric field between each antenna of the one or more antennas 320 and each antenna of the one or more antennas 321. The electric field will be strongest between an antenna of the one or more antennas 320 and an adjacent antenna of the one or more antennas 321. The interleaved and aligned spatial relationship of the antennas 320, 321 produces an electric field in a direction parallel to the plane defined by the first surface 234 of the substrate support assembly 238. The substrate 240 is positioned on the first surface 234 such that the latent image lines 255 are parallel to the electric field lines generated by the electrode assembly 216. Since the charged species 355 are charged, the charged species 355 are affected by the electric field. The electric field drives the charged species 355 generated by the photoacid generators in the photoresist layer 250 in the direction of the electric field. By driving the charged species 355 in a direction parallel with the latent image lines 255, line edge roughness may be reduced. The uniform directional movement is shown by the double headed arrow 370. In contrast, when a voltage is not applied to the first terminal 310 or the second terminal 311, an electric field is not created to drive the charged species 355 in any particular direction. As a result, the charged species 355 may move randomly, as shown by the arrows 370', which may result in wariness or line roughness.

Figure 4:
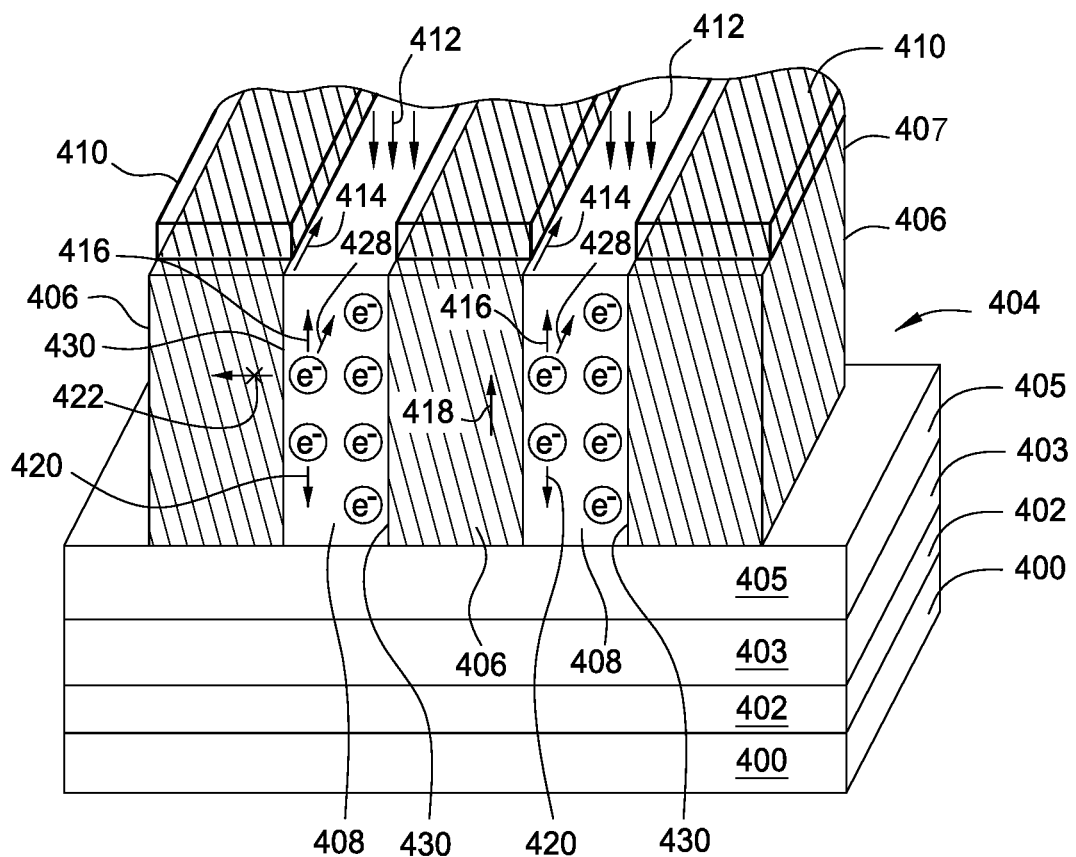
FIG. 4 depict an acid distribution control of a photoresist layer disposed on a film structure during an exposure process.

FIG. 4 depicts a film structure 404 disposed on a substrate 400 during a lithography exposure process. A photoresist layer 407 is disposed on the film structure 404. The film structure 404 includes an underlayer 405 disposed on a hardmask layer 403 and further on a target layer 402. The target layer 402 is later patterned for forming the desired device features in the target layer 402. In one example, the underlayer 405 may be an organic material, an inorganic material, or a mixture of organic or inorganic materials. In the embodiment wherein the underlayer 405 is an organic material, the organic material may be a cross-linkable polymeric material that may be coated onto the substrate 400 through a spin-on process, and then thermally cured so that the photoresist layer 407 may be later applied thereon. In the embodiment wherein the underlayer 405 is an inorganic material, the inorganic material may be a dielectric material formed by any suitable deposition techniques, such as CVD, ALD, PVD, spin-on-coating, spray coating or the like.

The underlayer 405 functions as a planarizing layer, an antireflective coat and/or photoacid direction controller, which may provide etch resistance and line edge roughness control when transferring the pattern into the underlying hardmask layer 403 and the target layer 402. The patterning resistant functionality from the underlayer 405 may work with the underlying hardmask layer 403 during the transfer of the resist process. In one example, the underlayer 405 does not interact with the photoresist layer 407 and does not have interfacial mixing and/or diffusion or cross contamination with the photoresist layer 407.

The underlayer 405 includes one or more additives, such as acid agents, (e.g., photoacid generators (PAGs) or acid catalyst), base agents, adhesion promoters or photo-sensitive components. The one or more additives may be disposed in organic solvent or resin and/or an inorganic matrix material. Suitable examples of the acid agents including photoacid generators (PAGs) and/or acid catalyst selected from a group consisting of sulfonic acids (e.g., p-toluenesulfonic acid, styrene sulfonic acid), sulfonates (e.g., pyridinium p-toluenesulfonate, pyridinium trilluoromethanesulfonate, pyridinium 3-nitrobenzensulfonate), and mixtures thereof. Suitable organic solvent may include homo-polymers or higher polymers containing two or more repeating units and polymeric backbone. Suitable examples of the organic solvent include, but are not limited to, propylene glycol methyl ether acetate (PGMEA), ethyl lactate (EL), propylene glycol methyl ether (PGME), propylene glycol n-propyl ether (PnP), cyclohexanone, acetone, gamma butyrolactone (GBL), and mixtures thereof.

In one example, the underlayer 405 provides active acid agents, base agents or ironoic/non-ironic species during the lithographic exposure process, pre- or post-exposure baking process, to assist control the photoacid flowing direction from the upper photoresist layer 407.

The hardmask layer 403 may be an ARC layer fabricated from a group consisting of silicon oxide, silicon nitride, silicon oxynitride, silicon carbide, amorphous carbon, doped amorphous carbon, TEOS oxide, USG, SOG, organic silicon, oxide containing material titanium nitride, titanium oxynitride, combinations thereof and the like.

The photoresist layer 407 may be a positive-tone photoresist and/or a negative-tone photoresist that are capable of undergoing a chemically amplified reaction. The photoresist layer 407 is a polymer organic material.

As discussed above, an electric field from the electrode 116, as well as a magnetic field from the magnets 296, may be applied during a lithography exposure process, pre- or post-exposure baking process, particularly, a post exposure baking process. In the example depicted in FIG. 4, the electric field and/or and magnetic field is applied during a lithography exposure process. During the lithographic exposure process, a light radiation 412 is directed to a first region 408 of the photoresist layer 407 while with a second region 406 of the photoresist layer 407 protected by a photomask 410. Photoacid, shown as e⁻ in FIG. 4, is generated in the exposed first region 408 in the photoresist layer 407 when photoacid generator (PAG) is exposed to the light radiation 412, such as a UV light radiation. However, oftentimes, movement of photoacid are generally random and photoacid distribution may not be evenly distributed in the first region 408 or may not have a clear boundary set at the interface 430 formed in a plane (interfaced with the second region 406) defining between the first region 408 and the second region 406, resulting in portion of photoacid drifting and diffusing into the second region 406, as shown in the arrow 422, unintended to have photoacid generation. As such, lateral photoacid movement (e.g., a direction parallel to a planar surface of the substrate 400) drifted into the second region 406, as shown in the arrow 422, may result in line edge roughness, resolution loss, photoresist footing, profile deformation, thus causing inaccurate feature transfer to the underlying target layer 402 and/or eventually leading to device failure.

Although the example discussed here is shown as the movement of electrons from the photoacid, it is noted that any suitable species, including charges, charged particles, photons, ions, electrons, or reactive species in any forms, may also have similar effects when the electric field is applied to the photoresist layer 407.

By applying an electric field and/or magnetic field to the photoresist layer 407, distribution of photoacid in the exposed first region 408 may be efficiently controlled and confined. The electric field as applied to the photoresist layer 407 may move photoacid in a vertical direction (e.g., y direction shown by arrows 416 and 420 substantially perpendicular to the planar surface of the substrate 400) with minimal lateral motion (e.g., x direction shown by the arrow 422) without diffusing into the adjacent second region 406. Generally, photoacid may have certain polarity that may be effected by the electric field or magnetic field applied thereto, thus orienting photoacid in certain directions, thus creating a desired directional movement of the photoacid in the exposed first region 408 without crossing into the adjacent protected second region 406. In one example, the photoacid may further be controlled to move directionally at a longitudinal direction (e.g., z direction shown by arrow 428, defined in a plane interfaced with the second region 406 of the photoresist layer 407 protected by the photomask 410) along a lateral plane, as shown by arrow 414, so as to control the longitudinal distribution of photoacid confined in the exposed first region 408 without crossing at a x direction, as shown by arrow 422, into the second region 406 of the photoresist layer 407. The magnetic field generated to the photoresist layer 407 may cause the electrons to orbit along a certain magnetic line, such as the longitudinal direction (e.g., z direction shown by arrow 428) so as to further control the photoacid in a desired three-dimensional distribution. The interaction between the magnetic field and the electric field may optimize trajectory of photoacid at a certain path as desired and confined in the exposed first region 408. Furthermore, vertical photoacid movement is desired to smooth out standing waves that are naturally produced by the light exposure tool, thus enhancing exposure resolution. In one embodiment, an electric field having a strength between about 0.1 MV/m and about 100 MV/m may be applied to the photoresist layer 407, during a lithographic exposure process, pre- or post baking process, to confine photoacid generated in the photoresist layer 407 in a vertical direction, e.g., at a y direction. In one embodiment, a magnetic field of between 0.1 Tesla (T) and 10 Tesla (T), along with the electric field, may be applied to the photoresist layer 407, during a lithographic exposure process, pre- or post baking process, to confine photoacid generated in the photoresist layer 407 in both longitudinal direction and vertical direction, e.g., at y and z directions, with minimum lateral direction, e.g., at x direction. While in combination of the magnetic field along with the electric field, the photoacid as generated may be further confined to be distributed in the longitudinal direction, e.g., in the direction shown by the arrow 428, remaining in the first region 408 of the photoresist layer 407, parallel along the interface 430 within the exposed first region 408.

Figure 5:
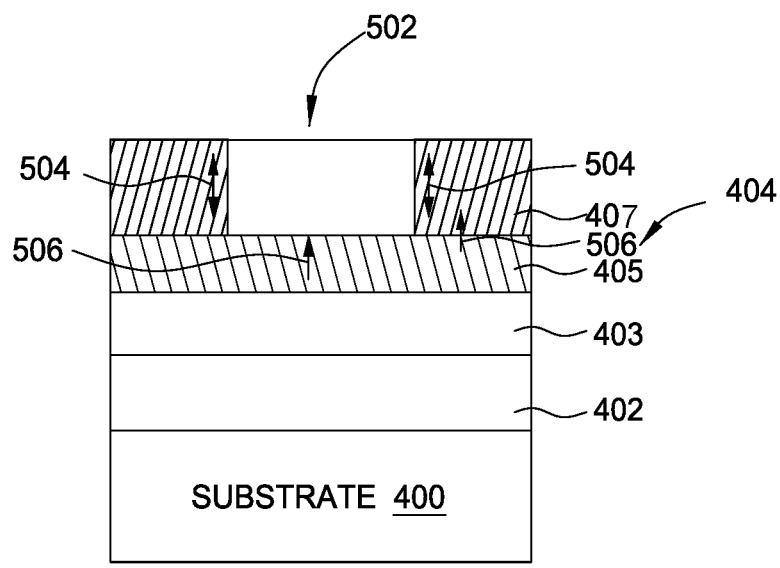
FIG. 5 depicts an acid distribution control of a photoresist layer on a film structure with a desired profile during a post exposure baking process.

FIG. 5 depicts another profile of photoacid distribution that may be controlled by utilizing an electric field, magnetic field, or combinations thereof to specifically control the photoacid located at certain zones during a post exposure baking process. The exposed region 502 of the photoresist layer 407 has chemically altered from the first region 408 as shown in FIG. 4, after the lithographic exposure process. After the photoresist layer 407 is lithographically exposed, a post exposure baking process is then performed to cure the photoresist layer 407, including the exposed region 502 and the remaining regions (e.g., shielded by the photomask during the lithographic exposure process) in the photoresist layer 407. During the post exposure baking process, the acid agent (e.g., such as photoacid), base agent, or other suitable additive from the underlayer 405 may be controlled in a manner that can assist distribution/movement of the photoacid within the photoresist layer 407 in a desired direction, as shown by the arrow 506 in FIG. 5. The additive in the underlayer 405 is diffused to the upper photoresist layer 504 during the post exposure baking process (or even during the lithographic exposure process), which helps to improve the sensitivity of the photoresist layer 407 so as to maintain a vertical profile of the photoresist layer 407. As a result, after development and rinse, a substantially vertical profile may be obtained in the photoresist layer 407.

In one embodiment, the additives, such as acid agents or photoacid as one example, from the underlayer 405 may be thermally driven upwards, as shown by the arrow 506, during the post exposure baking process so that the profile of the photoresist layer 407 may be efficiently controlled. Furthermore, as the additives from the underlayer 405 may be driven at a particular direction upward by the electric field, magnetic field, or combinations thereof during the post exposure baking process, the electrons provided from the additives may be controlled at certain moving path, such as predominantly in a vertical direction toward the photoresist layer 407. By doing so, the desired vertical structure may be defined and confined in the photoresist layer 407 as needed. It is noted that the examples of the photoresist layer 407 depicted in FIGS. 4-5 are formed with a straight edge profile (e.g., a vertical sidewall). However, the profile of the photoresist layer 407 may be formed in any desired shapes, such as a tapered or flare-out opening as needed.

After the post exposure baking process, an anisotropic etching process, or other suitable patterning/etching processes, may be performed to transfer features into the underlayer 405, the hardmask layer 403 and the target layer 402 as needed.

Figure 6:
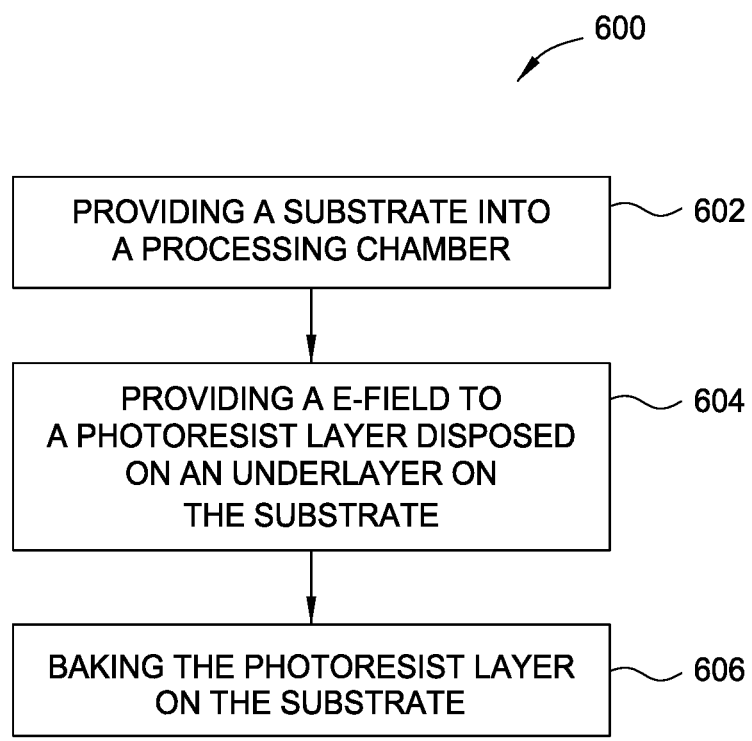
FIG. 6 is a flow diagram of one method of control acid distribution of a photoresist layer during an exposure process.

FIG. 6 depicts a flow diagram of a method 600 for utilizing an underlayer disposed under a photoresist layer to assist controlling photoacid distribution/diffusion in a photoresist layer during a lithographic exposure process or during a pre- or a post-exposure baking process. The method 600 beings at operation 602 by positioning a substrate, such as the substrate 400 described above, into a processing chamber, such as the processing chamber 200 depicted in FIGS. 2-3, with an electrode assembly and a magnetic assembly disposed therein.

At operation 604, after the substrate 400 is positioned, an electric field and/or a magnetic field may be individually or collectively applied to the processing chamber (during a lithographic exposure process and/or post exposure baking process) to control photoacid movement within in a photoresist layer having an underlayer disposed thereunder. After the electric field and/or a magnetic field is individually or collectively applied to the photoresist layer and the underlayer disposed on the substrate, photoacid as generated may move primarily in a vertical direction, a longitudinal direction, a circular direction, rather than a lateral direction. As a result of the assistance provided by the underlayer disposed under the photoresist layer, the photoacid movement in the photoresist layer may be efficiently controlled.

At operation 606, after the exposure process, a post exposure baking process is performed to cure the photoresist layer and the underlayer. During the baking process, an energy (e.g., an electric energy, thermal energy or other suitable energy) may also be provided to the underlayer. In one example depicted here, the energy is a thermal energy provided to the substrate during the post exposure baking process. The additives from the underlayer may also assist controlling the flow direction of the photoacid within the photoresist layer. By utilizing directional control of photoacid distribution in a predetermined path having a patterned photoresist layer, a desired edge profile with high resolution, does sensitivity, resistance to line collapse, and stochastics failure, and minimum line edge roughness may be obtained. In one example, by utilizing the underlayer structure, the critical dimension uniformity (CDU) (e.g., critical dimension variation) may be reduced from generally from 3 nm to 6 nm down to 1 nm to 2 nm or less, which is about 50% to 600% uniformity improvement. The line width roughness (LWR) may be reduced from generally from 3 nm to 5 nm down to 1 nm to 2 nm or less, which is about 50% to 600% roughness improvement. Furthermore, a distance between a first tip end of a first trench to a second tip end of a second trench may be reduced from generally from 30 nm to 50 nm down to 10 nm to 20 nm. Furthermore, some types of defects, such as corner rounding, footing, deformed profile, slanted sidewall profile, may also be efficiently eliminated and reduced.

The previously described embodiments have many advantages, including the following. For example, the embodiments disclosed herein may reduce or eliminate line edge/width roughness with high resolution and sharp edge profile. The aforementioned advantages are illustrative and not limiting. It is not necessary for all embodiments to have all the advantages.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, the method comprising:
  applying a photoresist layer comprising a photoacid generator to on a multi-layer film structure disposed on a substrate, wherein the multi-layer film structure comprises an underlayer, the underlayer comprising an organic solvent and an acid agent selected from the group consisting of a sulfonic acid, a sulfonate, and a mixture thereof;
  exposing a first portion of the photoresist layer unprotected by a photomask to a radiation light in a lithographic exposure process; and
  applying an electric field or a magnetic field to alter movement of photoacid generated from the photoacid generator substantially in a vertical direction.

2. The method of claim 1, further comprising:
  baking the photoresist layer and the underlayer; and
  applying an electric field or a magnetic field while baking the photoresist layer and the underlayer.

3. The method of claim 1, wherein the electric field or the magnetic field is applied to the photoresist layer during the lithographic exposure process.

4. The method of claim 2, wherein applying the electric field further comprises:
  performing a pre-exposure baking process to the photoresist layer and the underlayer disposed on the substrate, wherein the electric field or the magnetic field is applied to the photoresist layer during the pre-exposure baking process.

5. The method of claim 1, wherein the underlayer comprises one or more additives in an organic polymer solvent.

6. The method of claim 5, wherein the underlayer further comprises an additive comprising a base agent, adhesion promotor and photo-sensitive component, or any combination thereof.

7. The method of claim 5, wherein the organic polymer solvent is selected from the group consisting of propylene glycol methyl ether acetate (PGMEA), ethyl lactate (EL), propylene glycol methyl ether (PGME), propylene glycol n-propyl ether (PnP), cyclohexanone, acetone, gamma butyrolactone (GBL), and mixtures thereof.

8. The method of claim 1, wherein the multi-layer film structure further comprises a hardmask layer disposed under the underlayer and above the substrate.

9. The method of claim 8, wherein the hardmask layer is selected from the group consisting of silicon oxide, silicon nitride, silicon oxynitride, silicon carbide, amorphous carbon, doped amorphous carbon, TEOS oxide, USG, SOG, organic silicon, oxide containing material titanium nitride, titanium oxynitride, and combinations thereof.

10. A method of processing a substrate, the method comprising:
 applying a photoresist layer on an underlayer disposed on a substrate, the underlayer comprises an organic solvent and an acid agent selected from the group consisting of a sulfonic acid, a sulfonate, and a mixture thereof;
 exposing a first portion of the photoresist layer unprotected by a photomask to a radiation light in a lithographic exposure process;
 performing a baking process on the photoresist layer and the underlayer; and
 applying an electric field or a magnetic field while performing the baking process.

11. The method of claim 10, wherein exposing the first portion of the photoresist layer further comprises:
 applying an electric field or a magnetic field while performing the lithographic exposure process.

12. The method of claim 10, wherein the underlayer is an organic material.

13. The method of claim 10, wherein the underlayer further comprises an additive comprising a base agent, an adhesion promotor a photo-sensitive component, or any combination thereof.

14. The method of claim 10, wherein applying the electric field or the magnetic field while performing the baking process further comprises:
 altering movement of photoacid generated in the photoresist layer substantially in a vertical direction.

15. The method of claim 10, wherein applying the electric field or the magnetic field while performing the baking process further comprises:
 orienting photoacid in the photoresist layer while performing the baking process.

\* \* \* \* \*